United States Patent
Nakaoka et al.

(10) Patent No.: US 10,211,173 B1
(45) Date of Patent: Feb. 19, 2019

(54) SEMICONDUCTOR DEVICE AND MANUFACTURING METHOD THEREOF

(71) Applicant: Mitsubishi Electric Corporation, Tokyo (JP)

(72) Inventors: Yui Nakaoka, Tokyo (JP); Hirobumi Matsui, Tokyo (JP); Shinichi Hosomi, Tokyo (JP); Yuji Kawano, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 15/901,366

(22) Filed: Feb. 21, 2018

(30) Foreign Application Priority Data

Oct. 25, 2017 (JP) .................................. 2017-205801

(51) Int. Cl.
*H01L 23/00* (2006.01)

(52) U.S. Cl.
CPC .............. *H01L 24/05* (2013.01); *H01L 24/03* (2013.01); *H01L 2224/03019* (2013.01); *H01L 2224/03502* (2013.01); *H01L 2224/05073* (2013.01); *H01L 2224/05124* (2013.01); *H01L 2224/05573* (2013.01); *H01L 2224/05647* (2013.01); *H01L 2224/05657* (2013.01);
(Continued)

(58) Field of Classification Search
CPC ......... H01L 24/25; H01L 24/82; H01L 24/24; H01L 2224/3225; H01L 2224/73267; H01L 2224/8203; H01L 2224/04105; H01L 2224/24226; H01L 2224/92244; H01L 24/05; H01L 24/03
See application file for complete search history.

(56) References Cited

U.S. PATENT DOCUMENTS

| 6,383,909 B1 | 5/2002 | Nagaya et al. |
| 7,998,793 B2 * | 8/2011 | Sato .................. H01L 21/67092 |
| | | 257/E23.158 |
| 9,905,522 B1 * | 2/2018 | Lin ........................ H01L 24/05 |

(Continued)

FOREIGN PATENT DOCUMENTS

| JP | 2-58801 A | 2/1990 |
| JP | 5-121407 A | 5/1993 |

(Continued)

OTHER PUBLICATIONS

Communication dated Nov. 6, 2018 issued by the Japanese Patent Office in counterpart application No. 2017-205801, 15 pages with translation.

*Primary Examiner* — Hoa (Vikki) B Trinh

(74) *Attorney, Agent, or Firm* — Sughrue Mion, PLLC; Richard C. Turner

(57) ABSTRACT

A pad electrode such that a conductive film is used as the pad electrode in a semiconductor device has an object of preventing Al corrosion and improving Au bonding wire durability. A semiconductor device according to the invention includes a conductive film of Al or having Al as a main component on which a signal processing circuit and a pad electrode portion are formed, a metal film formed on the conductive film, and a protective film formed on the metal film, wherein a metal film region in which atoms derived from the metal film are implanted is formed on a surface of the conductive film exposed by an opening formed in one portion of the protective film and the metal film, and adopted as the pad electrode.

5 Claims, 7 Drawing Sheets

(52) U.S. Cl.
CPC ............. *H01L 2224/05666* (2013.01); *H01L 2224/05669* (2013.01); *H01L 2224/05684* (2013.01)

(56) References Cited

U.S. PATENT DOCUMENTS

| | | | | |
|---|---|---|---|---|
| 2005/0194584 | A1* | 9/2005 | Slater, Jr. | ............ H01L 21/2654 257/13 |
| 2014/0103532 | A1* | 4/2014 | Huang | .................. H01L 23/585 257/773 |
| 2015/0200158 | A1* | 7/2015 | Okumura | ............ H01L 23/5226 257/368 |

FOREIGN PATENT DOCUMENTS

| | | | |
|---|---|---|---|
| JP | 6-177200 | A | 6/1994 |
| JP | 3233997 | B2 | 12/2001 |
| JP | 3425927 | B2 | 7/2003 |
| JP | 2006-310482 | A | 11/2006 |
| JP | 2013-26465 | A | 2/2013 |

* cited by examiner

| additive content (%) | a.u. |
|---|---|
| 0 | 1 |
| 0.03 | 1.1 |
| 0.05 | 2.3 |
| 2 | 7.2 |
| 5 | 8.4 |

SEMICONDUCTOR DEVICE AND MANUFACTURING METHOD THEREOF

BACKGROUND OF THE INVENTION

Field of the Invention

The present invention relates to a semiconductor device and a manufacturing method thereof, and in particular, relates to aluminum corrosion prevention and bonding wire durability improvement of a semiconductor device having a pad electrode.

Description of the Related Art

An existing semiconductor device is such that, in order for a power supply and an electronic signal to be input and output from and to external equipment, a bonding pad electrode formed of aluminum (hereafter called Al) or an Al alloy is provided on a semiconductor element chip and a signal processing circuit board, and the pad electrode and an electrode of the signal processing circuit board or a pad electrode of another semiconductor element chip are electrically connected by pressing and heating a fine metal (for example, Au) wire, and joining the wire to a pad surface by forming an alloy of the metal of the pad electrode and the metal of the wire (refer to Patent Document 1).

Also, as an existing temperature sensor device, which is one kind of semiconductor device, there is a temperature sensor device that is one kind of "resistance temperature detector" that utilizes the characteristic of electrical resistance of a metal changing in response to a temperature change, wherein a sensor element chip such that platinum (Pt), which has good temperature characteristics and little temporal change, is used in a temperature measuring element and a signal processing circuit for amplifying a signal and outputting the signal to an exterior are mounted, and a bonding pad electrode for inputting and outputting a power supply and an electronic signal from and to external equipment is provided on the sensor element chip and the signal processing circuit (refer to Patent Document 2).

A bonding pad electrode on this kind of existing sensor element chip having metal wiring is such that an Al film that is to form the pad electrode is deposited on a support substrate including a thermally oxidized film ($SiO_2$), the film is patterned using photolithography and etching technology to form the pad electrode, a protective film is subsequently deposited so as to cover the pad electrode, and furthermore, the protective film on a surface of the pad electrode is removed using photolithography and etching technology to form an aperture portion, thereby forming a bonding pad (for example, refer to Patent Document 2 and Patent Document 3).

Patent Document 1: JP2013-26465 A
Patent Document 2: JPH02-058801 A
Patent Document 3: Japanese Patent No. 3,425,927

Herein, an existing sensor device is such that a material having Al as a main component (Al, AlSi, AlSiCu, or the like) is generally used as a wiring material, and when opening one portion of the wiring and fabricating a pad electrode in this kind of sensor device, a fluorine based etching gas such as carbon tetrafluoride (hereafter called $CF_4$) is used, and an etching process is carried out.

However, as Al is easily corroded by an acid or alkali, it is thought that with the existing method, residue of the fluorine based etching gas such as $CF_4$ used when opening the pad electrode reacts with moisture in the atmosphere to form hydrofluoric acid (HF), and causes Al corrosion. When this kind of Al corrosion occurs, bonding reliability may decrease, and as the pad surface is roughened by Al corrosion, the pad appears blackened.

In order to prevent this kind of Al corrosion, it is necessary to store in an atmosphere of controlled temperature and humidity, or store sealed with dry air, until assembly is completed, and facilities such as conveying means and storage equipment, storage space, and the like, are needed.

Also, a manufacturing method described in, for example, Patent Document 3 is known as a method of preventing corrosion of an Al film surface. This manufacturing method is such that baking is implemented for 30 minutes or more at a temperature of 200° C. to 380° C. in an atmosphere including water vapor before a wire bonding step after a pad electrode is opened, thereby forming an aluminum oxide layer on a surface of a bonding pad.

However, there is a case in which this kind of manufacturing method cannot be applied to a sensor device having a film on which heat treatment at 200° C. or higher cannot be carried out.

Also, there is a known method whereby $H_2O_2$, which is an oxidant, is added when carrying out water vapor processing, as shown in JP2006-310482 A.

In this case, processing time is 30 seconds, and the device is unlikely to be damaged by heat, but as $H_2O_2$, which has high reactivity, is used, it is supposed that remaining $H_2O_2$ and a material used in a sensor device react. Consequently, there is concern that material used in the sensor device is limited.

Furthermore, pad electrodes are such that wire bonding is carried out in a process of assembling a sensor device, whereby a pad electrode of a sensor element chip and an electrode of a signal processing circuit or a pad electrode of another sensor element chip are electrically connected. Mainly gold (hereafter called Au) wire is used in the wire bonding. When this kind of Au wire and an Al pad electrode are used in combination, alloying occurs at a junction with the Au wire, forming an Au—Al junction, and when the junction is exposed to a high temperature, an intermetallic compound (IMC) grows, and the junction deteriorates.

When the junction deteriorates, there is concern that bonding durability will decrease, and that sensor device reliability will be lost.

Causes of this kind of deterioration are as below.
1. A decrease in junction strength due to an inconsistent expansion rate in an interlayer between $Au_5Al_2$ and $Au_4Al$ among a multiple of intermetallic compounds formed in a diffusion layer by an advance of Au—Al diffusion.
2. A decrease in junction strength caused by a void occurring (Kirkendall Effect) in a periphery of the junction due to a difference in the diffusion coefficients of Au and Al.

As a countermeasure, there is a method whereby an impurity such as Cu or Si is added to Al to restrict grain boundary diffusion by a reduction in holes at a grain boundary or by compound precipitation, as shown in Japanese Patent No. 3,233,997. When adding an impurity, however, the added impurity precipitates at the Al grain boundary, because of which it is difficult for Al grain caused by heat treatment to grow. Consequently, there is a problem in that grain size decreases, and electromigration characteristics deteriorate. Furthermore, there is a problem in that workability worsens compared with a case of a pure Al film, as shown in JPH05-121407 A.

SUMMARY OF THE INVENTION

The invention, having been contrived in order to resolve the heretofore described kinds of problem, has an object of having an advantage of preventing Al corrosion, and in addition, improving bonding durability.

A semiconductor device according to the invention is characterized by including a support substrate, a conductive film formed of aluminum or an aluminum alloy, provided on the support substrate, on which a signal processing circuit and a pad electrode are formed, a metal film formed on the conductive film, and a protective film formed on the metal film, wherein a metal film region in which atoms derived from the metal film are implanted is formed on a surface of the conductive film exposed by an opening formed in one portion of the protective film and the metal film, and adopted as the pad electrode.

Also, a semiconductor device manufacturing method according to the invention is characterized by including a step of forming a conductive film formed of aluminum or an aluminum alloy that is to form a pad electrode on a support substrate, a step of forming a metal film on the conductive film, a step of forming a protective film on the metal film, a step of etching one portion of the protective film with a fluorine based etching gas, thereby forming an aperture, and a step of removing the metal film in the aperture by ion milling, wherein a metal film region in which atoms derived from the metal film are implanted is formed on a surface of the conductive film, and adopted as the pad electrode.

According to the semiconductor device according to the invention, holes at a pad electrode grain boundary are reduced by providing an aperture wherein metal derived from a metal film is implanted in a conductive film, and grain boundary diffusion can be restricted, whereby a highly reliable semiconductor device can be obtained.

Also, according to the semiconductor device manufacturing method according to the invention, a metal film also remains immediately above a conductive film during an etching process using a fluorine based etching gas when carrying out a step of opening a wire bonding pad, and the metal film functions as a protective film, because of which the conductive film is not directly exposed to the etching gas including fluorine, and Al corrosion of a surface of a pad electrode can be prevented, whereby a highly reliable semiconductor device can be obtained.

The foregoing and other objects, features, aspects, and advantages of the invention will become more apparent from the following detailed description of the invention when taken in conjunction with the accompanying drawings.

DETAILED DESCRIPTION OF THE PREFERRED EMBODIMENTS

First Embodiment

Figure 1:
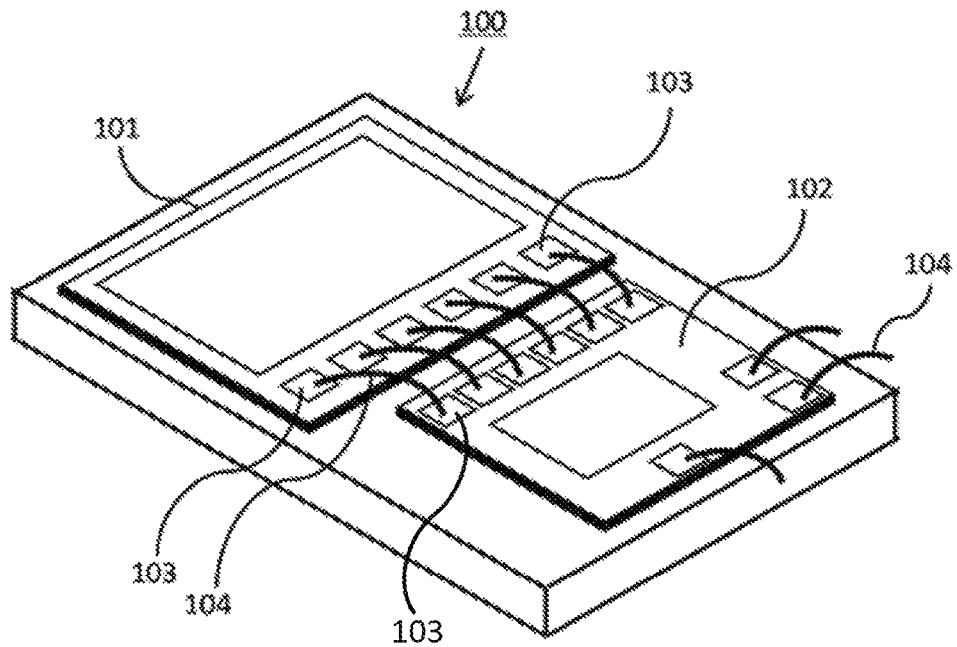
FIG. 1 is a bird's-eye view showing a semiconductor device to which the invention is applied.

FIG. 1 is a bird's-eye view showing a semiconductor device to which the invention is applied.

Hereafter, a description will be given with a sensor device, which is one kind of semiconductor device, as an example.

In the drawing, a sensor element chip 101 and a signal processing circuit board 102 are provided in a sensor device 100, and a bonding pad (pad electrode) 103 for inputting and outputting a power supply and an electronic signal from and to external equipment is provided on the sensor element chip 101 and the signal processing circuit board 102. A fine metal (for example gold, hereafter called Au) wire 104 is pressed and heated in order to electrically connect the pad electrode 103 and an electrode of the signal processing circuit board 102 or a pad electrode of another sensor element chip, and the wire 104 is joined to a surface of the pad electrode 103 by an alloy of the metal of the pad electrode 103 and the metal of the wire 104 being formed.

A material formed of aluminum (hereafter called Al) or an Al alloy is generally used in the pad electrode 103.

Figure 2:
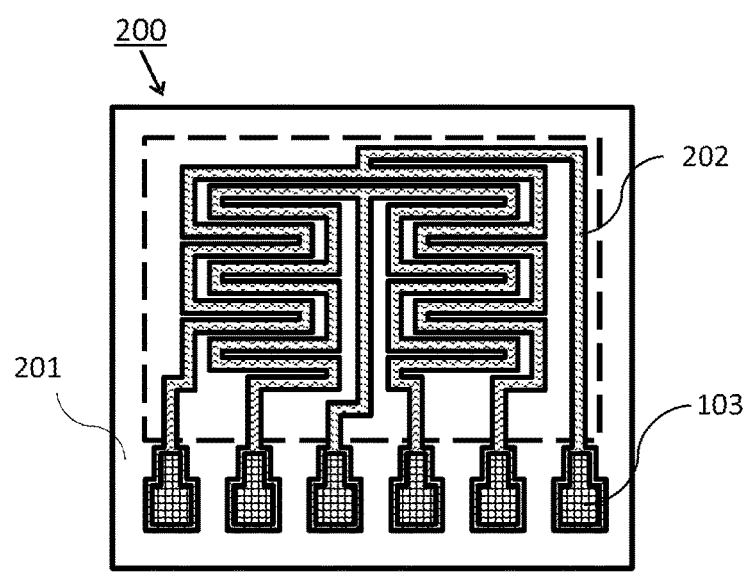
FIG. 2 is a plan view showing a temperature sensor element chip to which the invention is applied.

Also, FIG. 2 is a plan view showing a temperature sensor device 200, which is one sensor device 100 to which the invention is applied. In the drawing, the temperature sensor device 200 is one kind of "resistance temperature detector" that utilizes the characteristic of electrical resistance of a metal changing in response to a temperature change, wherein a temperature sensor element chip 201 (sensor portion 202) formed by platinum (hereafter called Pt), which has good temperature characteristics and little temporal change, being used in a temperature measuring element and a signal processing circuit for amplifying a signal and outputting the signal to an exterior are mounted. The bonding pad electrode 103 for inputting and outputting a power supply and an electronic signal from and to external equipment is provided on the temperature sensor element chip 201 and the signal processing circuit.

Figure 3:
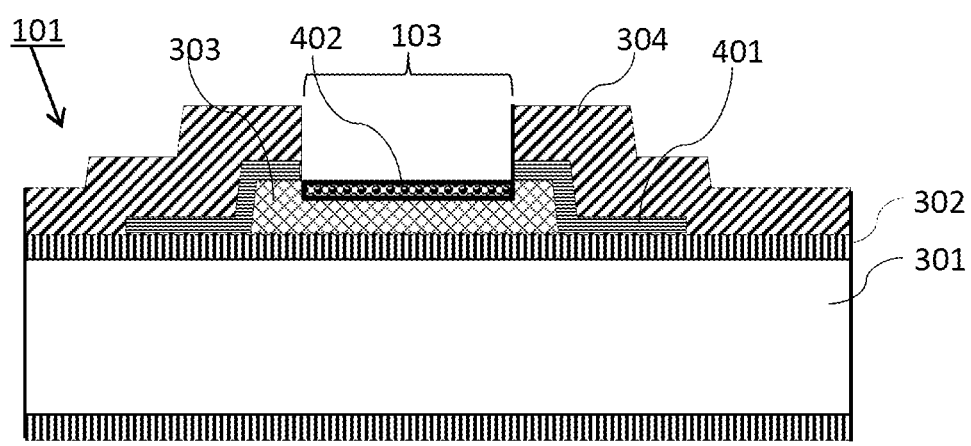
FIG. 3 is a sectional view showing a main portion of a sensor device that is a first embodiment according to the invention.

A cross-section of a main portion of the heretofore described kind of sensor device 100 is shown in FIG. 3.

In FIG. 3, the sensor element chip 101 includes a support substrate 301 formed of silicon (hereafter called Si), an oxide film 302 oxidized to a thickness of, for example 500 nm on the support substrate 301, a pad electrode portion 303 formed of an Al film formed in a predetermined pattern on the oxide film 302, a metal film 401 formed by a titanium tungsten (hereafter called TiW) film being deposited on the pad electrode portion 303, and a protective film 304 formed of silicon nitride (hereafter called SiN) formed on the metal film 401, wherein a metal film region 402 in which atoms derived from the metal film 401 are implanted is formed on a surface of the Al film exposed by providing an opening in one portion of the protective film 304 and the metal film 401, and adopted as the pad electrode 103.

Next, using FIGS. 4A to 4H, a method of manufacturing this kind of sensor device 100 will be described.

Figure 4A:
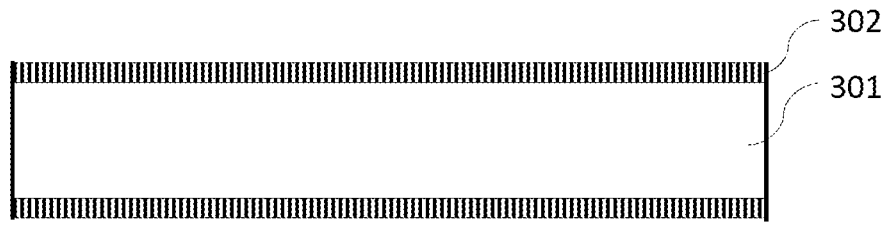
FIG. 4A is a sectional view for describing a first step of manufacturing the sensor device that is the first embodiment according to the invention.

Firstly, as shown in FIG. 4A, the oxide film 302 oxidized to a thickness of, for example, 500 nm is formed on the bare Si support substrate 301 (a first step).

Figure 4B:
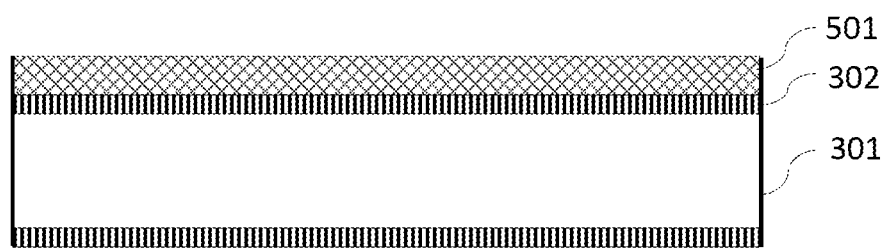
FIG. 4B is a sectional view for describing a second step of manufacturing the sensor device that is the first embodiment according to the invention.

Next, as shown in FIG. 4B, a conductive film 501, which is to form a pad electrode of the sensor element chip 101, and a wiring film are deposited on the oxide film 302 using, for example, a physical vapor deposition (PVD) device (a second step).

Herein, provided that the conductive film 501 is formed of Al or an Al alloy having Al as a main component (AlSi, AlSiCu, or the like), no particular restriction is imposed. Also, it is sufficient that a thickness of the conductive film 501 is set to a thickness such that reliability is assured even when stress is applied to the conductive film, and furthermore, a film forming device is not limited to the PVD device.

Figure 4C:
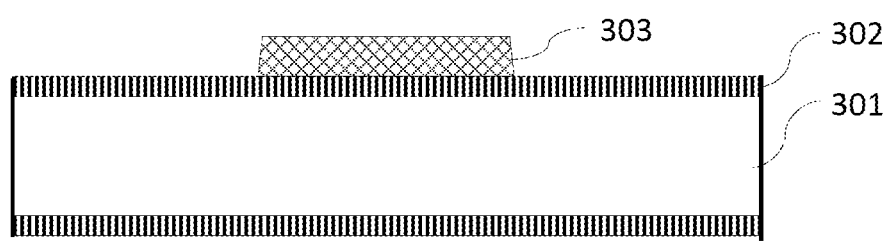
FIG. 4C is a sectional view for describing a third step of manufacturing the sensor device that is the first embodiment according to the invention.

Next, the conductive film 501 is removed by etching into a desired pattern using technology such as photolithography, forming the pad electrode portion 303 as shown in FIG. 4C (a third step).

Herein, for example, a wet etching method is used as an etching removal method, and the conductive film 501 other than the pad electrode portion 303 is removed by etching using an Al mixed acid liquid. Also, provided that the Al film functions as a pad electrode, any etching removal method may be used as a method of removing the Al film by etching.

Figure 4D:
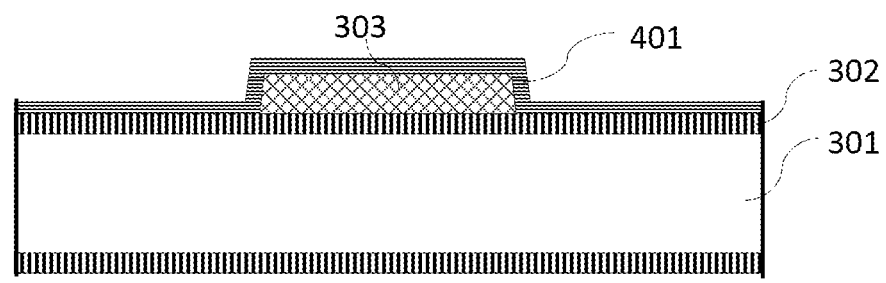
FIG. 4D is a sectional view for describing a fourth step of manufacturing the sensor device that is the first embodiment according to the invention.

Next, as shown in FIG. 4D, the metal film 401 formed of TiW is deposited on the oxide film 302 and the pad electrode portion 303 (a fourth step).

No particular film specifications are specified for the metal film 401, and provided that the film functions as a protective layer of the Al film when processing with a fluorine based etching gas such as $CF_4$, to be described hereafter, there is no problem whatever the structure, film type, material, and film thickness may be. Also, any film forming device may be used.

Figure 4E:
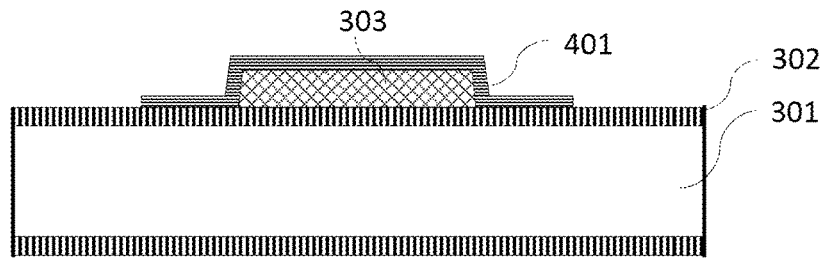
FIG. 4E is a sectional view for describing a fifth step of manufacturing the sensor device that is the first embodiment according to the invention.

Next, using, for example, an ion milling device, the metal film 401 is removed by etching using technology such as photolithography, forming a desired pattern as shown in FIG. 4E (a fifth step).

Figure 4F:
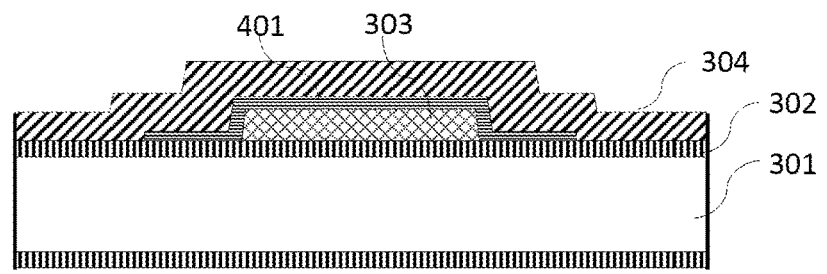
FIG. 4F is a sectional view for describing a sixth step of manufacturing the sensor device that is the first embodiment according to the invention.

Next, as shown in FIG. 4F, the protective film 304 for protecting the sensor device surface is deposited (a sixth step).

Herein, for example, a SiN film is formed as the protective film 304 using a plasma-enhanced chemical vapor deposition (PECVD) device.

As the protective film 304 is ground in a subsequent step, it is necessary to deposit taking an amount by which the film is reduced into consideration, or to protect by forming a resist or the like on the protective film 304.

Also, a material used in order to form the protective film 304 is not particularly limited provided that the material is a material that can be used as a protective film in the relevant technological field. Furthermore, any film forming device may be used.

Figure 4G:
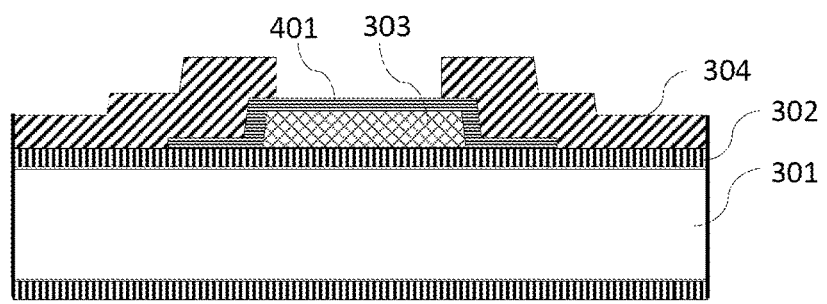
FIG. 4G is a sectional view for describing a seventh step of manufacturing the sensor device that is the first embodiment according to the invention.

Next, the protective film 304 is removed by etching into a desired pattern using photolithography and etching technology using a reactive ion etching (RIE) device that uses a fluorine based etching gas such as $CF_4$, thereby forming an aperture portion in the protective film 304, as shown in FIG. 4G (a seventh step).

At this time, rather than removing the metal film 401 by etching, the metal film 401 is left intact immediately above the pad electrode portion 303.

Any method may be used as an etching method provided that the method is a method of etching using a fluorine based etching gas such as $CF_4$, and any etching device may be used.

Figure 4H:
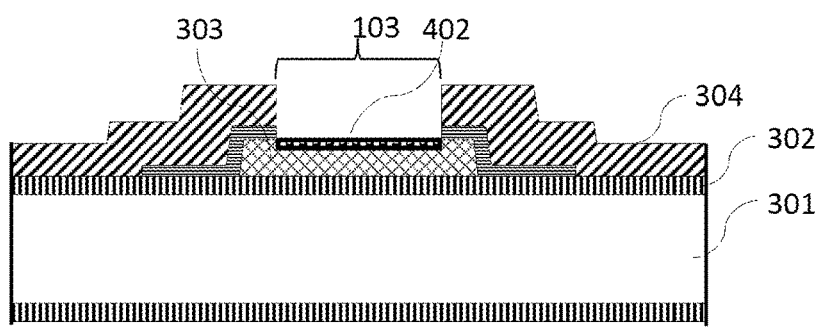
FIG. 4H is a sectional view for describing an eighth step of manufacturing the sensor device that is the first embodiment according to the invention.

Next, on the metal film 401 in the aperture portion being removed, and over-etching carried out, using etching technology that uses an ion milling device, the metal film region 402 in which metal (Ti) derived from the metal film is implanted is formed in the pad electrode portion 303 formed of the conductive film 501, as shown in FIG. 4H (an eighth step).

Herein, although it is sufficient that the ion milling conditions are such that the metal film 401 can be removed, an electric charge may accumulate in a wafer surface when ion milling is carried out, and when the electric charge flows to a signal processing circuit connected via wiring, there is concern that the electric charge will cause the circuit to be damaged or to deteriorate. Because of this, the ion milling process is preferably carried out in a short time.

Also, there is concern that the conductive film 501 in which metal (Ti) derived from the metal film is implanted will be removed when over-etching is carried out, because of which the amount of over-etching after the metal film 401 immediately above the pad electrode portion 303 is removed is preferably small.

The kind of sensor element chip 101 having the pad electrode 103 shown in FIG. 3 is formed by the heretofore described kinds of step.

According to the heretofore described sensor device 100 manufacturing method, the metal film 401 also remains immediately above the pad electrode portion 303 during the etching process using a fluorine based etching gas such as $CF_4$ when carrying out the step of opening the pad electrode, and the metal film 401 functions as a protective layer, because of which the Al film is not directly exposed to the etching gas including fluorine, and discoloration of the pad electrode portion 303 due to Al corrosion can be prevented. Also, reliability of the pad electrode portion 303 can be increased by Al corrosion being prevented.

Furthermore, by the metal film 401 being removed by ion milling in a state wherein the metal film 401 is immediately above the Al film, an Al layer in which metal (Ti) derived from the metal film is implanted is formed on the surface of the pad electrode portion 303. By metal being added in this way, holes at a grain boundary decrease, and grain boundary diffusion can be restricted. Consequently, growth of an intermetallic compound and an occurrence of voids at an Au—Al junction, which proliferate at a high temperature, can be restricted, whereby bonding reliability can be increased.

Second Embodiment

Next, using FIGS. 5A to 5H, a case of manufacturing a temperature sensor device, which is a second embodiment of the invention, will be described.

Figure 5A:
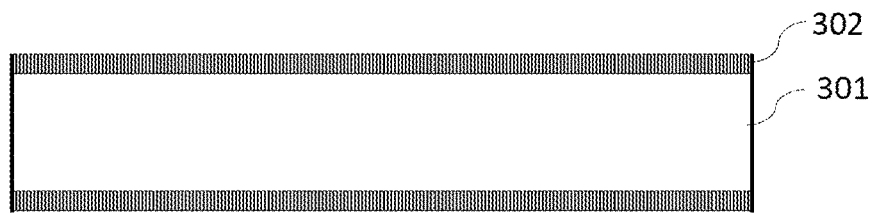
FIG. 5A is a sectional view for describing a first step of manufacturing a sensor device that is a second embodiment according to the invention.
Figure 5B:
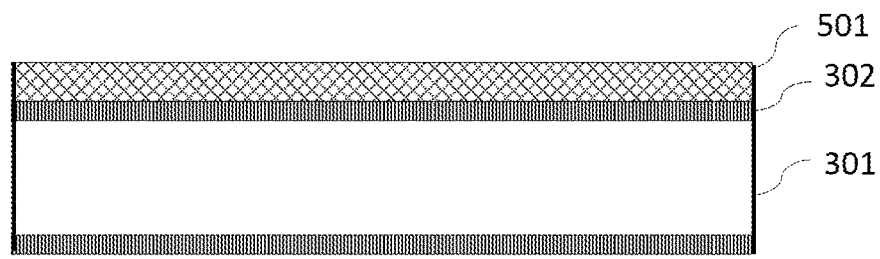
FIG. 5B is a sectional view for describing a second step of manufacturing the sensor device that is the second embodiment according to the invention.
Figure 5C:
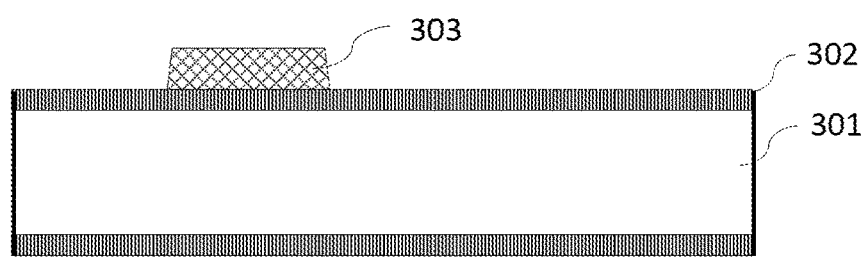
FIG. 5C is a sectional view for describing a third step of manufacturing the sensor device that is the second embodiment according to the invention.

Firstly, FIGS. 5A to 5C, which show a first step to a third step, are manufactured in the same way as FIGS. 4A to 4C in the first embodiment, because of which a detailed description will be omitted.

Figure 5D:
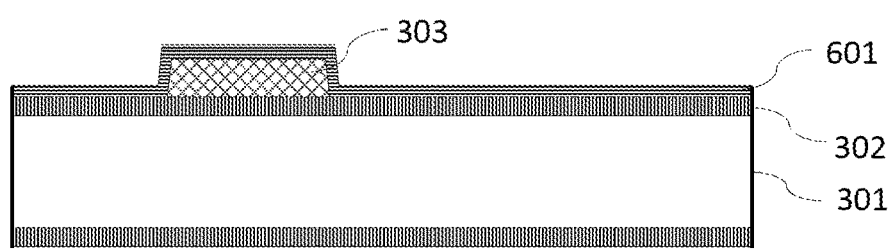
FIG. 5D is a sectional view for describing a fourth step of manufacturing the sensor device that is the second embodiment according to the invention.

Next, as shown in FIG. 5D, a temperature sensing film 601 formed of Pt is deposited on the oxide film 302 and the pad electrode portion 303 using a PVD device (a fourth step).

The temperature sensing film 601 also functions as a protective layer on the Al film that is to form the pad electrode portion 303 when processing with a fluorine based etching gas such as $CF_4$.

Figure 5E:
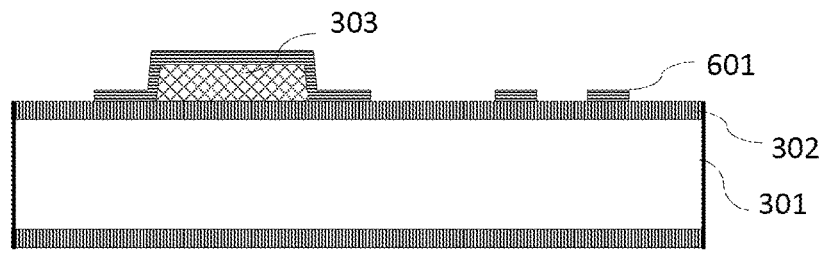
FIG. 5E is a sectional view for describing a fifth step of manufacturing the sensor device that is the second embodiment according to the invention.

Next, as shown in FIG. 5E, the temperature sensing film 601 is selectively removed by etching into a desired pattern using technology such as photolithography (a fifth step).

Herein, a desired pattern means a sensor element, a pad electrode, and a temperature sensing element, which are to form a detecting portion of the temperature sensor, and wiring that connects pad electrodes. Also, as an etching removal method, etching removal is carried out using, for example, an ion milling device.

Figure 5F:
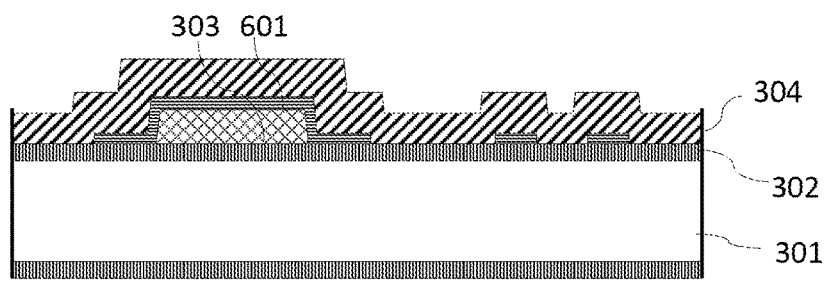
FIG. 5F is a sectional view for describing a sixth step of manufacturing the sensor device that is the second embodiment according to the invention.

Next, as shown in FIG. 5F, the protective film 304 formed of, for example, a SiN film is deposited using a plasma-enhanced chemical vapor deposition (PECVD) device (a sixth step).

A thickness of the protective film 304 is not particularly restricted provided that the thickness is such that the temperature sensor element chip can be protected, but as the protective film 304 is simultaneously ground by ion milling in a subsequent step, it is necessary to deposit taking an amount by which the film is reduced into consideration. Also, the protective film 304 may be protected by forming a resist or the like on the protective film 304.

Also, a material used in order to form the protective film 304 is not particularly limited provided that the material is a material that can be used as a protective film in the relevant technological field. Furthermore, regarding a film forming method too, any film forming device may be used provided that the film has a function as a protective film.

Figure 5G:
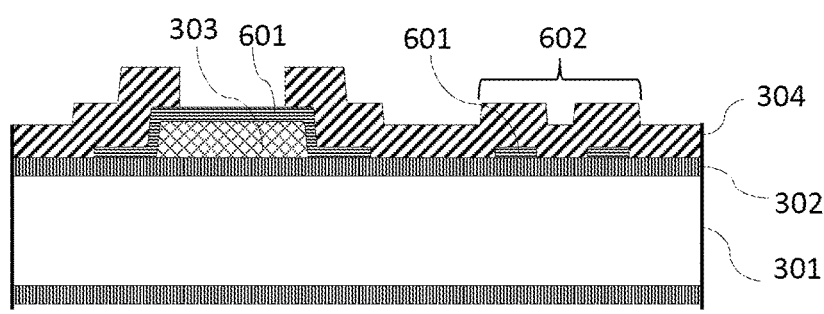
FIG. 5G is a sectional view for describing a seventh step of manufacturing the sensor device that is the second embodiment according to the invention.

Next, in the same way as in the first embodiment, the protective film 304 is removed by etching into a desired pattern, thereby forming an aperture portion in the protective film 304, and exposing the temperature sensing film 601, as shown in FIG. 5G (a seventh step).

Herein, the protective film 304 on the temperature sensing film 601 configuring a sensor element 602 is left intact rather than being etched.

Figure 5H:
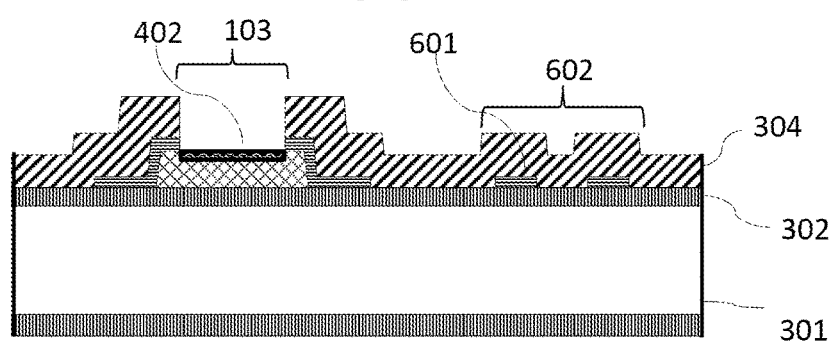
FIG. 5H is a sectional view for describing an eighth step of manufacturing the sensor device that is the second embodiment according to the invention.

Next, on the metal in the temperature sensing film 601 in the aperture portion being removed, and over-etching carried out, by etching using an ion milling device, the metal film region 402 in which metal (Pt) derived from the metal film is implanted is formed as shown in FIG. 5H (an eighth step).

The kind of temperature sensor element chip 201 having the pad electrode 103 shown in FIG. 2 is formed by the heretofore described kinds of step.

It goes without saying that the temperature sensor element chip 201 in the second embodiment achieves the same advantages as the first embodiment. Furthermore, as the second embodiment is characterized in that the temperature sensing film 601 functions as both the sensor element 602 and the pad electrode 103, there is no longer a need to newly form a metal film, and this step can be omitted. Consequently, a sensor element chip with good productivity can be fabricated at low cost.

Furthermore, Al corrosion can be prevented even when using a low temperature-curing photosensitive polyimide such that Al corrosion is likely to occur.

Third Embodiment

In the second embodiment, a case of manufacturing a temperature sensor device is described, but the invention can also be implemented in the same way for a giant magnetoresistance (GMR) sensor device, which is one kind of sensor device.

A GMR sensor device is such that a GMR sensor element chip, which reacts to a magnetic field and outputs the magnetic field as an electrical signal, and a signal processing circuit for amplifying the signal and outputting the signal to the exterior are mounted, and a bonding pad electrode for inputting and outputting a power supply and an electronic signal from and to external equipment is provided.

This kind of GMR sensor device is such that an artificial lattice film that is a GMR element, wherein a magnetic layer formed of a cobalt (hereafter called Co) layer and a non-magnetic layer formed of a copper (hereafter called Cu) layer are alternately deposited, is formed in place of the temperature sensing film 601 of the second embodiment using a PVD device, and the GMR sensor device is subsequently fabricated via the same steps. Herein, a thickness and a number of layers of the magnetoresistive film are not limited, and also, Fe/Cr, NiFe/Cu/Co/Cu, or Co/Cu can be used as the GMR element.

It goes without saying that the kind of magnetic sensor device of the third embodiment also achieves the same advantages as the first embodiment or second embodiment.

Next, a description will be given of results of confirming by microscope in order to evaluate Al corrosion.

A test sample is a sample formed using the method of the first embodiment.

Figures 6, 7:
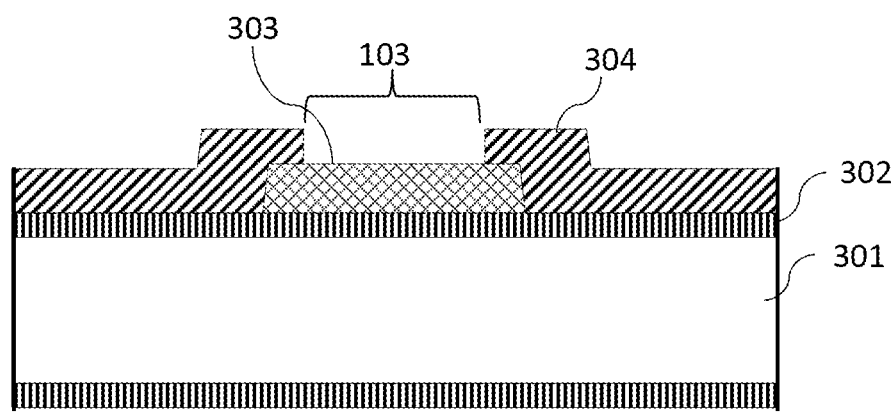
FIG. 6 is a sectional view showing a sensor device that is a comparative example.
FIG. 7 is a diagram wherein characteristics of a sensor device according to the invention and the comparative example are compared.

Meanwhile, regarding a comparative example, a wafer such that the oxide film 302, the pad electrode portion 303 formed of an Al film, and the protective film 304 are formed sequentially on a silicon substrate, after which the protective film 304 is removed by etching using a fluorine based etching gas such as $CF_4$, is adopted as a comparative example sample, as shown in FIG. 6.

Herein, a thickness of each of the materials of the test sample and the comparative example sample is such that the oxide film 302 is formed to 500 nm, the pad electrode portion 303 to 1.3 μm, and the protective film 304 to 0.8 μm.

Results of confirming by microscope whether or not there is Al corrosion after the two kinds of sample fabricated in this way are stored at room temperature are such that the Al film in the comparative example is corroded and discolored black, but in the test sample of this embodiment the metal film functions as a protective layer, because of which no Al corrosion occurs, and no abnormality in appearance is observed.

Next, in order to confirm the effect of implanting metal derived from the metal film, analysis is implemented using secondary ion mass spectrometry (SIMS).

A test sample is a sample formed using the method of the third embodiment, and a GMR film (including Co and Cu) is used as the metal film 401. Also, a thickness of each of the materials of the test sample is such that the oxide film 302 is formed to 500 nm, the pad electrode portion 303 to 1.3 μm, and the protective film 304 to 0.75 μm.

A result of analyzing whether or not metal derived from the metal film is implanted in the Al film by carrying out SIMS on the test sample fabricated in this way is such that Co and Cu, which are metals derived from the metal film, are detected.

Next, a test at a high temperature (200° C.) is implemented in order to evaluate bonding wire durability.

A test sample is a sample formed using the method of the third embodiment, and an ion milling acceleration voltage is changed every 100V within a range of 200 to 800V.

Meanwhile, regarding a comparative example sample, a wafer such that the oxide film 302, the pad electrode portion 303, and the protective film 304 are formed sequentially on a silicon substrate, after which the protective film 304 is removed by etching with a fluorine based etching gas such as $CF_4$ using photolithography, thereby opening the pad electrode portion, is adopted as a sample.

Herein, a thickness of each of the materials of the test sample and the comparative example sample is such that the oxide film 302 is formed to 500 nm, the pad electrode portion 303 to 1.3 μm, and the protective film 304 to 0.8 μm.

When a Cu density of the samples fabricated in this way is investigated using an energy dispersive X-ray spectrometer (EDX), a total amount of metal (Co and Cu) derived from the metal film included in the test sample is 0.03 to 5%.

Meanwhile, five kinds of comparative example sample having additive contents of 0%, 0.03%, 0.05%, 2%, and 5% are subjected to testing at a high temperature of 200 degrees, and times at which bonding wire detachment occurs are plotted. At this time, the time at which bonding wire detachment occurs in the comparative example sample is taken to be 1, and compared with a time at which bonding wire detachment occurs in the test sample.

As shown in FIG. 7, results are such that in the case of the samples with 0.03% additives, there is no change in the time at which bonding wire detachment occurs between the test sample and the comparative example sample, but in cases of 0.05% or more additives, the time taken until bonding wire detachment occurs is two times or more longer in the test sample than in the comparative example sample. That is, it is confirmed that when 0.05% or more of metal is added, there is an advantage in that wire bonding durability can be increased.

Also, in the sample to which 2% of metal derived from the metal film is added and the sample to which 5% is added, an extension rate of the time taken until bonding wire detachment occurs slows down. Furthermore, $Al_2Cu$ precipitates in crystal grains of the Al metal, which is of a polycrystalline structure, when Cu is added to Al, and when a large amount of Cu is included in the Al, $Al_2Cu$ precipitates at a grain boundary in addition to precipitating in the crystal grains, and corrosion occurs when washing with water due to the $Al_2Cu$ precipitated at the grain boundary. In consideration of these points, an upper limit of the amount of metal added is taken to be 5%.

In the drawing, a.u. is an abbreviation of arbitrary unit.

In the embodiments, a description is given with a sensor device as an example, but the invention, not being limited to the embodiments in any way, is applicable in the same way to any semiconductor device that has a conductive film formed of aluminum or an aluminum alloy.

Also, the embodiments can be combined, and each embodiment can be modified or abbreviated as appropriate, without departing from the scope of the invention.

Furthermore, a processing device and processing conditions can be changed as appropriate within the scope of the technical idea of the invention.

What is claimed is:

1. A semiconductor device, comprising:
   a support substrate;
   a conductive film formed of aluminum or an aluminum alloy, provided on the support substrate, on which a signal processing circuit and a pad electrode are formed;
   a metal film formed on the conductive film; and
   a protective film formed on the metal film,
   wherein the pad electrode is formed in a portion of the conductive film underlying the metal film, the portion being exposed by an opening formed in a part of the protective film and the metal film and including implanted metal from the metal film, at a surface region of the portion.

2. The semiconductor device according to claim 1, wherein any metal material of titanium tungsten, platinum, cobalt, or copper is used as the metal film.

3. The semiconductor device according to claim 1, wherein a density of the metal from the metal film that is implanted in the portion is in a range from 0.05 to 5%.

4. The semiconductor device according to claim 1, wherein the metal that forms a temperature sensing film or a magnetoresistive film is used as the metal film.

5. A semiconductor device manufacturing method, which is a method of manufacturing a semiconductor device in which a pad electrode for connecting to an exterior is formed, the semiconductor device manufacturing method comprising:
   a step of forming a conductive film formed of aluminum or an aluminum alloy that is to form the pad electrode on a support substrate;
   a step of forming a metal film on the conductive film;
   a step of forming a protective film on the metal film;
   a step of etching one portion of the protective film with a fluorine based etching gas, thereby forming an aperture; and
   a step of removing the metal film in the aperture by etching in a manner such that a portion of metal from the metal film is implanted at a surface region of the conductive film,
   wherein a portion of the surface region is adopted as the pad electrode.

* * * * *